(12) United States Patent
Lee

(10) Patent No.: US 10,811,468 B2
(45) Date of Patent: Oct. 20, 2020

(54) DISPLAY DEVICE

(71) Applicant: SAMSUNG DISPLAY CO., LTD., Yongin-si, Gyeonggi-Do (KR)

(72) Inventor: Hyeonbum Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/443,009

(22) Filed: Jun. 17, 2019

(65) Prior Publication Data

US 2020/0066802 A1 Feb. 27, 2020

(30) Foreign Application Priority Data

Aug. 21, 2018 (KR) .................. 10-2018-0097635

(51) Int. Cl.
*H01L 27/32* (2006.01)
*H01L 51/52* (2006.01)

(52) U.S. Cl.
CPC .......... *H01L 27/322* (2013.01); *H01L 27/323* (2013.01); *H01L 27/3276* (2013.01); *H01L 51/5246* (2013.01); *H01L 51/5256* (2013.01)

(58) Field of Classification Search
None
See application file for complete search history.

(56) References Cited

U.S. PATENT DOCUMENTS

| 10,475,857 | B2* | 11/2019 | Song | H01L 51/5203 |
| 2014/0168584 | A1* | 6/2014 | Lee | G02F 1/133514 |
| | | | | 349/106 |
| 2017/0278900 | A1* | 9/2017 | Yang | H01L 51/0097 |
| 2018/0033834 | A1 | 2/2018 | Jun et al. | |
| 2018/0095195 | A1* | 4/2018 | Kim | G02B 5/201 |
| 2019/0165325 | A1* | 5/2019 | Lee | G06F 3/0412 |

FOREIGN PATENT DOCUMENTS

| KR | 1020140087816 | 7/2014 |
| KR | 1020170112441 | 10/2017 |
| KR | 1020170113821 | 10/2017 |
| KR | 1020180014397 | 2/2018 |
| KR | 1020180036428 | 4/2018 |

* cited by examiner

*Primary Examiner* — Ali Naraghi
(74) *Attorney, Agent, or Firm* — F. Chau & Associates, LLC

(57) ABSTRACT

A display device includes a display panel having a display area and a color filter layer including a black matrix and a color filter. Peripheral areas and a center area are in the display area. Light emitting areas and a non-light emitting area are in the display area. A center black matrix is in the non-light emitting area of the center area, and a peripheral black matrix is in the non-light emitting area of the peripheral area. Center color filters are in the light emitting areas of the center area, and peripheral color filters are in the light emitting areas of the peripheral area. First and second adjacent light emitting areas are in the peripheral area. First and second peripheral color filters are respectively in the first and second light emitting areas, and overlap each other in the non-light emitting area between the first and second light emitting areas.

20 Claims, 11 Drawing Sheets

DISPLAY DEVICE

CROSS-REFERENCE TO RELATED APPLICATIONS

This U.S. non-provisional patent application claims priority under 35 U.S.C. § 119 to Korean Patent Application No. 10-2018-0097635, filed on Aug. 21, 2018, the disclosure of which is incorporated by reference herein in its entirety.

TECHNICAL FIELD

Exemplary embodiments of the inventive concept relate to a display device, and more particularly, to an organic light emitting display device.

DISCUSSION OF THE RELATED ART

Various display devices used for multimedia devices such as televisions, mobile phones, tablet computers, navigation systems, game consoles, etc. are being developed. A display device may employ various types of display panels such as, for example, a liquid crystal display panel or an organic light emitting display panel.

The optical characteristics of light emitted from the organic light emitting display panel may refer to different characteristics, but typically refer to a viewing angle luminance ratio and a viewing angle chrominance. The viewing angle luminance ratio is the luminance of light emitted from an oblique angle with respect to the luminance of front emitted light. In addition, the viewing angle chrominance may be defined as a color difference due to the optical path difference according to the viewing angle.

The organic light emitting display panel may have different optical characteristics depending on the position of the display area, and the display quality may be deteriorated based on the position of the display area.

SUMMARY

Exemplary embodiments of the inventive concept improve display quality of a display module by compensating a difference in optical characteristics of a display module due to a difference in thickness of a first sealing organic film in a center region and a peripheral region.

According to an exemplary embodiment, a display device includes a display panel and a color filter layer. The display panel includes a display area in which an image is displayed. A center area and a peripheral area outside the center area are defined in the display area, and a plurality of light emitting areas and a non-light emitting area are defined in the display area. The color filter layer is disposed on the display panel and includes a black matrix and a color filter. The black matrix includes a center black matrix disposed in the non-light emitting area of the center area and a peripheral black matrix disposed in the non-light emitting area of the peripheral area. The color filter includes a plurality of center color filters disposed in the light emitting areas of the center area and a plurality of peripheral color filters disposed in the light emitting areas of the peripheral area. The first and second light emitting areas adjacent to each other from among the plurality of light emitting areas are defined in the peripheral area. A first peripheral color filter from among the plurality of peripheral color filters is disposed in the first light emitting area, a second peripheral color filter from among the plurality of peripheral color filters is disposed in the second light emitting area, and the first and second peripheral color filters overlap each other in the non-light emitting area between the first and second light emitting areas. The center color filters do not overlap each other.

In an exemplary embodiment, the display device further includes a level difference compensating layer disposed in the non-light emitting area of the peripheral area and disposed below the peripheral black matrix.

In an exemplary embodiment, a third light emitting area different from the first and second light emitting areas from among the plurality of light emitting areas is further defined in the peripheral area. A third peripheral color filter from among the plurality of peripheral color filters is disposed in the third light emitting area. The level difference compensating layer is disposed in the non-light emitting area between the first and second light emitting areas. The first to third peripheral color filters include different materials, and the level difference compensating layer includes the same material as the third peripheral color filter.

In an exemplary embodiment, the level difference compensating layer is disposed between the peripheral black matrix and the first and second peripheral color filters overlapping each other.

In an exemplary embodiment, the level difference compensating layer is disposed between the first and second peripheral color filters.

In an exemplary embodiment, the level difference compensating layer is disposed below the first and second peripheral color filters.

In an exemplary embodiment, the display panel includes a base layer, a plurality of display elements disposed on the base layer, disposed in the display area, and configured to display the image, and a sealing layer configured to seal the display elements.

In an exemplary embodiment, the plurality of display elements is disposed in the plurality of light emitting areas.

In an exemplary embodiment, the sealing layer includes a sealing organic film covering the display area. The sealing organic film in the center area has a first thickness, and the sealing organic film in the peripheral area has a second thickness less than the first thickness.

In an exemplary embodiment, the sealing organic film includes an acrylic monomer.

In an exemplary embodiment, the sealing layer further includes first and second sealing inorganic films facing each other with the sealing organic film disposed therebetween.

In an exemplary embodiment, each of the center color filters is disposed in one of the light emitting areas of the center area, and the center black matrix is disposed on a portion of each of the center color filters.

In an exemplary embodiment, a third light emitting area different from the first and second light emitting areas from among the plurality of light emitting areas is further defined in the peripheral area, a third peripheral color filter from among the plurality of peripheral color filters is disposed in the third light emitting area, the first to third peripheral color filters include different materials, and the peripheral black matrix is in contact with at least one of the first to third peripheral color filters.

In an exemplary embodiment, a width of a portion of the first peripheral color filter overlapping the second peripheral color filter is about equal to a width of the non-light emitting area disposed between the first and second light emitting areas.

In an exemplary embodiment, a lower surface of the center black matrix and a lower surface of each of the center color filters contacts a same layer.

According to an exemplary embodiment, a display device includes a display panel including a display area in which an image is displayed, and a color filter layer. A center area and a peripheral area outside the center area are defined in the display area, and a plurality of light emitting areas and a non-light emitting area are defined in the display area. The color filter layer is disposed on the display panel and includes a black matrix, a color filter, and a level difference compensating layer. The black matrix includes a center black matrix disposed in the non-light emitting area of the center area and a peripheral black matrix disposed in the non-light emitting area of the peripheral area. The color filter includes a plurality of center color filters disposed in the light emitting areas of the center area and a plurality of peripheral color filters disposed in the light emitting areas of the peripheral area. First and second light emitting areas adjacent to each other from among the plurality of light emitting areas are defined in the peripheral area. A first peripheral color filter from among the plurality of peripheral color filters is disposed in the first light emitting area, a second peripheral color filter from among the plurality of peripheral color filters is disposed in the second light emitting area, and the first and second peripheral color filters overlap each other in the non-light emitting area between the first and second light emitting areas. The level difference compensating layer is disposed on a different layer than the first and second peripheral color filters in the non-light emitting area between the first and second light emitting areas.

In an exemplary embodiment, the level difference compensating layer is disposed below the peripheral black matrix, a third light emitting area from the plurality of light emitting areas different from the first and second light emitting areas is further defined in the peripheral area, a third peripheral color filter from among the plurality of peripheral color filters is disposed in the third light emitting area, the level difference compensating layer is disposed in the non-light emitting area between the second and third light emitting areas, the first to third peripheral color filters include different materials, and the level difference compensating layer includes the same material as the third peripheral color filter.

According to an exemplary embodiment, a display device includes a display panel including a display area in which an image is displayed, and a color filter layer. A center area and a peripheral area outside the center area are defined in the display area, and a plurality of light emitting areas and a non-light emitting area are defined in the display area. The color filter layer is disposed on the display panel and includes a black matrix and a color filter. The black matrix includes a center black matrix disposed in the non-light emitting area of the center area and a peripheral black matrix disposed in the non-light emitting area of the peripheral area. The color filter includes a plurality of center color filters in the light emitting areas of the center area and a plurality of peripheral color filters disposed in the light emitting areas of the peripheral area. A distance between the center black matrix and the display panel is less than a distance between the peripheral black matrix and the display panel.

In an exemplary embodiment, the display panel includes a base layer, a plurality of display elements disposed on the base layer, disposed in the display area, and configured to display the image, and a sealing layer configured to seal the display elements.

In an exemplary embodiment, the sealing layer includes a sealing organic film covering the display area. The sealing organic film in the center area has a first thickness, and the sealing organic film in the peripheral area has a second thickness less than the first thickness.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
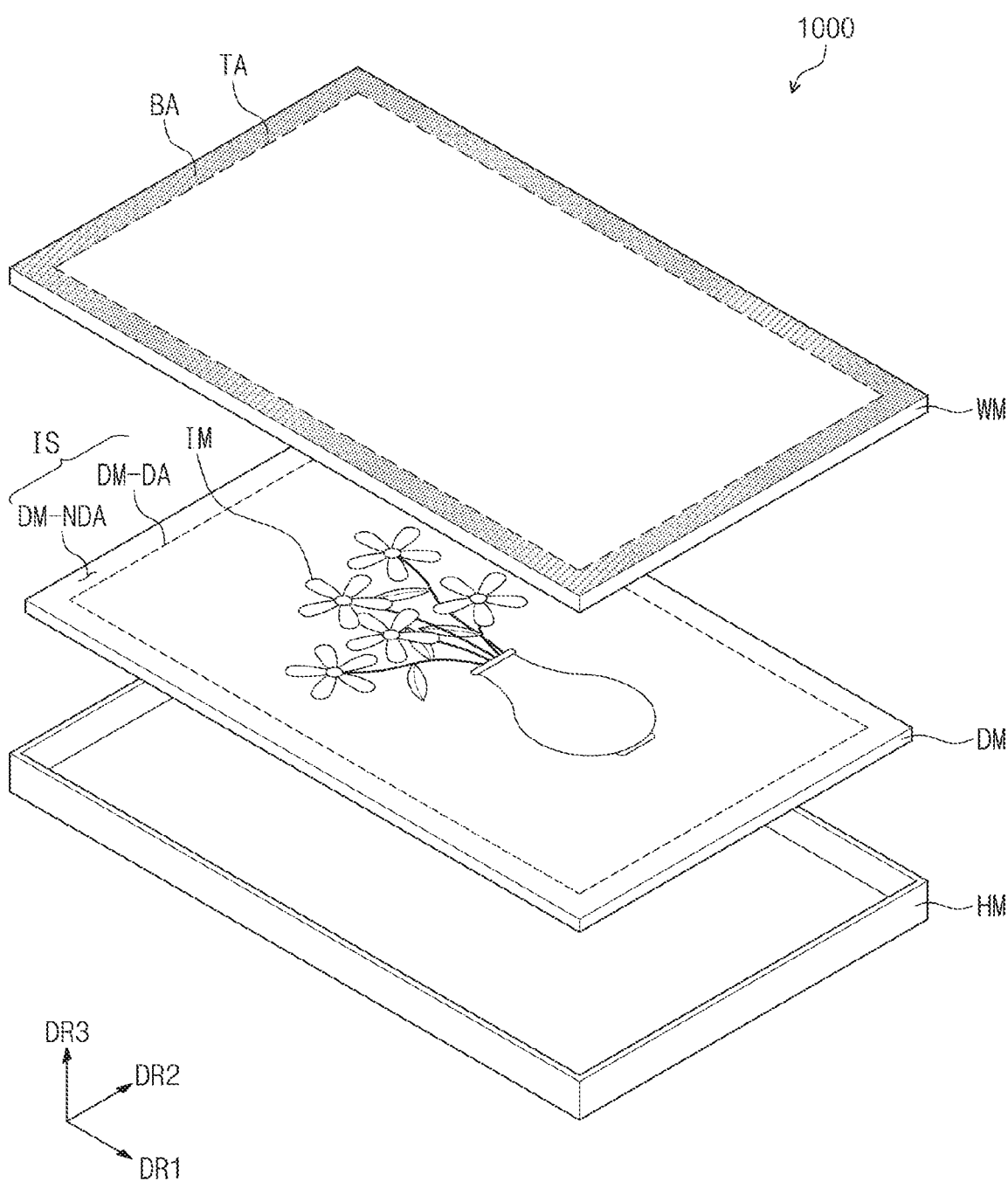
FIG. 1 is a perspective view of a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

Figure 2:
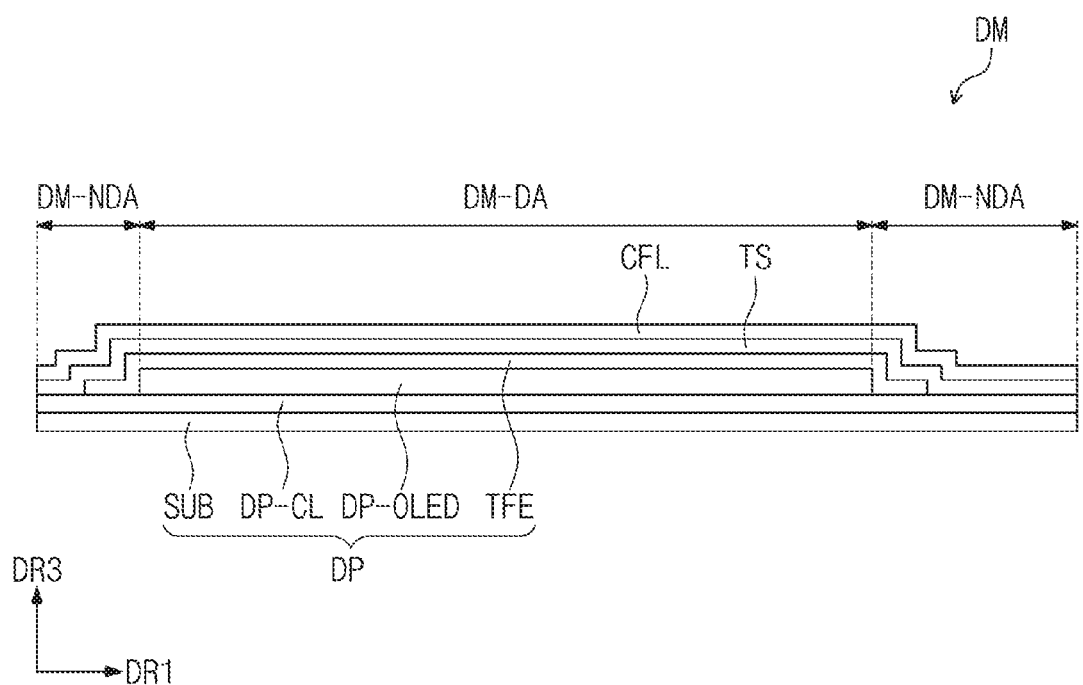
FIG. 2 is a cross-sectional view of a display module according to an exemplary embodiment of the inventive concept.

FIG. 1 is a perspective view of a display device 1000 according to an exemplary embodiment of the inventive concept. FIG. 2 is a cross-sectional view of a display module according to an exemplary embodiment of the inventive concept.

The display device 1000 according to an exemplary embodiment may be applied to small and medium-sized electronic devices such as, for example, mobile phones, tablets, car navigation systems, game consoles, and smart watches, in addition to large-sized electronic devices such as, for example, televisions and monitors.

Referring to FIG. 1, the display device 1000 may include a display module DM, a window member WM, and a housing member HM.

A display surface IS on which an image IM of the display module DM is displayed is parallel to a surface that a first direction axis DR1 and a second direction axis DR2 define. The normal direction of the display surface IS, that is, a thickness direction of the display module DM, indicates a third direction axis DR3. The front surface (also referred to as an upper surface) and the rear surface (also referred to as a lower surface) of each member are divided by the third direction axis DR3. However, the directions that the first to third direction axes DR1, DR2, and DR3 indicate are not limited to the directions shown, and may be converted to other directions as a relative concept. Hereinafter, first to third directions refer to the same reference numerals of the respective directions that the first to third direction axes DR1, DR2, and DR3 indicate.

The display module DM may be a flexible display module or a rigid display module.

As shown in FIG. 1, the display module DM includes a display area DM-DA in which an image IM is displayed and a non-display area DM-NDA adjacent to the display area DM-DA. The non-display area DM-NDA is an area in which no image is displayed. FIG. 1 illustrates a vase with flowers as one example of the image IM. As one example, the display area DM-DA may have a rectangular form. The non-display area DM-NDA may surround the display area DM-DA. However, the inventive concept is not limited thereto, and the form of the display area DM-DA and the form of the non-display area DM-NDA may be modified.

The window member WM is disposed on the display module DM. The window member WM protects the display module DM. The window member WM may be coupled to the housing member HM to form an inner space. The window member WM and the housing member HM may define the appearance of the display device 1000.

The window member WM may be divided into a transmission area TA and a bezel area BA on a plane. The transmission area TA may be an area that transmits most of the incident light. The transmission area TA is optically transparent. The transmission area TA may have a light transmittance of about 90% or more. The transmission area TA may correspond to the display area DM-DA of the display module DM. For example, the location of the transmission area TA may correspond to the location of the display area DM-DA of the display module DM.

The bezel area BA may be an area that shields most of the incident light. The bezel area BA prevents the components disposed under the window member WM from being visible from the outside. Also, the bezel area BA may reduce reflection of light incident from outside the window member WM. The bezel area BA may correspond to the non-display area DM-NDA of the display module DM. For example, the location of the bezel area BA may correspond to the location of the non-display area DM-NDA of the display module DM.

The bezel area BA may be adjacent to the transmission area TA. The shape of the transmission area TA on a plane may be defined by the bezel area BA.

The housing member HM provides a predetermined inner space. The display module DM is accommodated in the inner space. In addition to the display module DM, various electronic components such as, for example, a power supply, a storage device, an audio input/output module, a camera, etc. may be mounted in the inner space of the housing member HM.

FIG. 2 is a cross-sectional view of the display module DM according to an exemplary embodiment of the inventive concept. FIG. 2 shows a section that the first direction axis DR1 and the third direction axis DR3 define.

As shown in FIG. 2, the display module DM includes a display panel DP, a touch detection unit TS (also referred to as a touch detection layer), and a color filter layer CFL. The display module DM according to an exemplary embodiment of the inventive concept may further include a protection member disposed on the lower surface of the display panel DP.

The display panel DP may be a light-emitting display panel, and is not particularly limited. For example, the display panel DP may be an organic light emitting display panel or a quantum dot light emitting display panel. The light emission layer of the organic light emission display panel includes an organic light emission material. The light emission layer of a quantum dot light emission display panel includes quantum dot, and quantum rod. Hereinafter, the display panel DP is described as an organic light emitting display panel.

The display panel DP includes a base layer SUB, a circuit element layer DP-CL disposed on the base layer SUB, a display element layer DP-OLED, and a thin film sealing layer TFE. The display panel DP may further include functional layers such as, for example, an antireflection layer, a refractive index control layer, etc.

The base layer SUB may include at least one plastic film. The base layer SUB may include, for example, a plastic substrate, a glass substrate, a metal substrate, or an organic/inorganic composite material substrate as a flexible substrate. The display area DM-DA and the non-display area DM-NDA described with reference to FIG. 1 may be defined equally in the base layer SUB.

The circuit element layer DP-CL includes at least one intermediate insulating layer and circuit elements. The intermediate insulating layer includes at least one intermediate inorganic film and at least one intermediate organic film. The circuit element includes, for example, signal lines, a driving circuit of a pixel, etc. A detailed description thereof is provided below.

The display element layer DP-OLED includes at least organic light emitting diode OLED. The display element layer DP-OLED may further include an organic layer such as, for example, a pixel definition layer.

The sealing layer TFE seals the display element layer DP-OLED. The sealing layer TFE includes at least one inorganic film (hereinafter referred to as a sealing inorganic film). The sealing layer TFE may further include at least one organic film (hereinafter referred to as a sealing organic film). The sealing inorganic film protects the display element layer DP-OLED from moisture/oxygen, and the sealing organic film protects the display element layer DP-OLED from foreign substances such as dust particles. The sealing organic layer may include, for example, a silicon nitride layer, a silicon oxynitride layer, a silicon oxide layer, a titanium oxide layer, or an aluminum oxide layer. The sealing organic layer may include, for example, an acryl-based organic layer, but is not limited thereto.

The touch detection unit TS obtains coordinate information of an external input. The touch detection unit TS may be disposed directly on the organic light emitting sealing layer TFE. Herein, the term "directly disposed" means being formed through a continuous process, excluding being attached through an additional adhesive layer. However, the inventive concept is not limited thereto. For example, in an exemplary embodiment, the touch detection unit TS may be attached using a bonding layer.

The touch detection unit TS may have a multi-layer structure. The touch detection unit TS may include a single layer or a multilayer conductive layer. The touch detection unit TS may include a single layer or a multilayer insulation layer.

The touch detection unit TS, for example, may detect an external input in a capacitive manner. However, the inventive concept is not limited thereto. For example, in exemplary embodiments, the touch detection unit TS may detect an external input through an electromagnetic induction method or a pressure detection method.

The color filter layer CFL may be disposed on the touch detection unit TS. The color filter layer CFL not only transmits the light generated in the display element layer DP-OLED, but also may reduce the reflectance of the external light. As the external light passes through the color filter layer CFL, the amount of light decreases.

The color filter layer CFL may include a color filter and a black matrix. The laminated structure of the color filter layer CFL may be different depending on the area of the display module DM, as will be described in further detail below.

Figure 3:
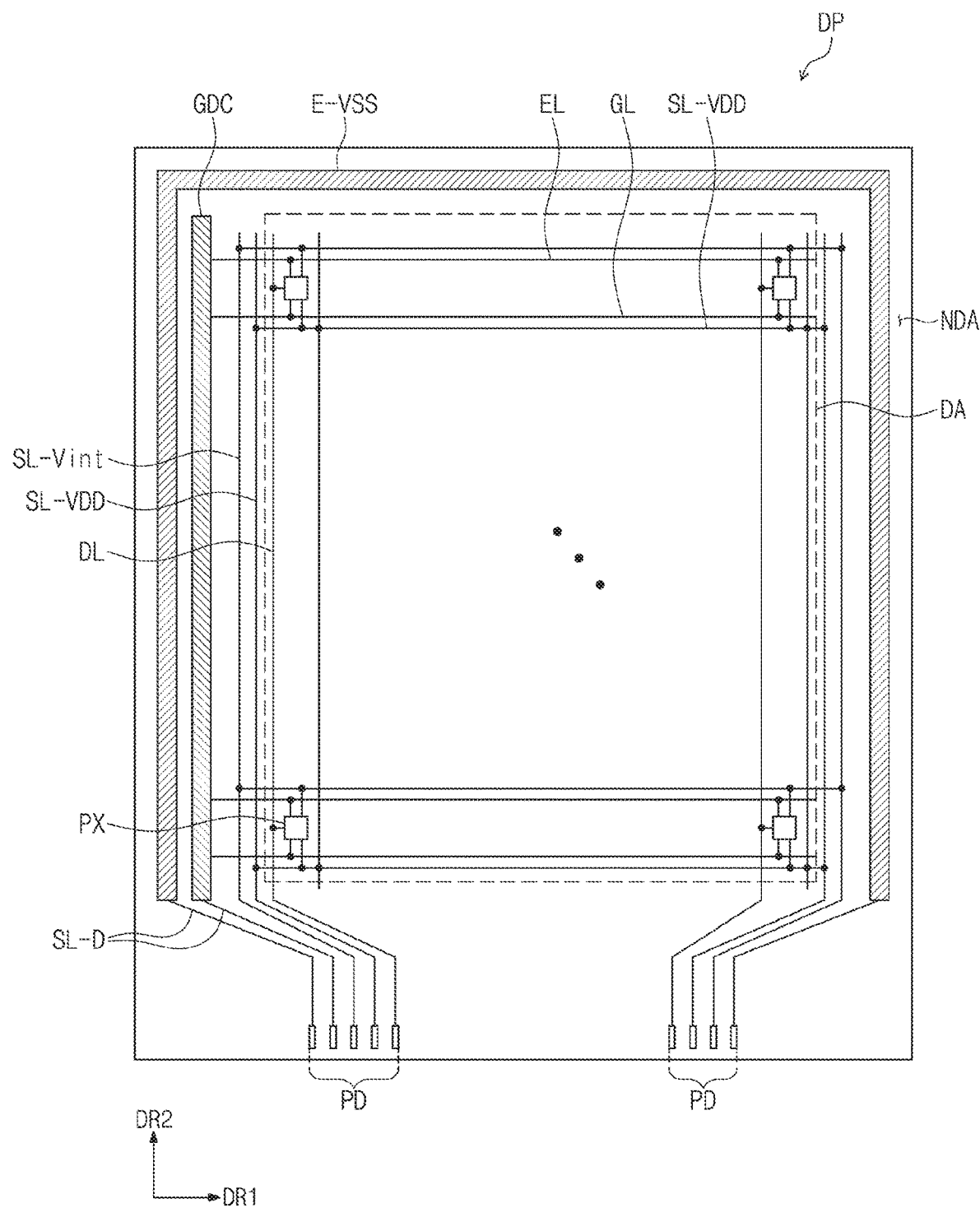
FIG. 3 is a plan view of a display panel according to an exemplary embodiment of the inventive concept.
Figure 4:
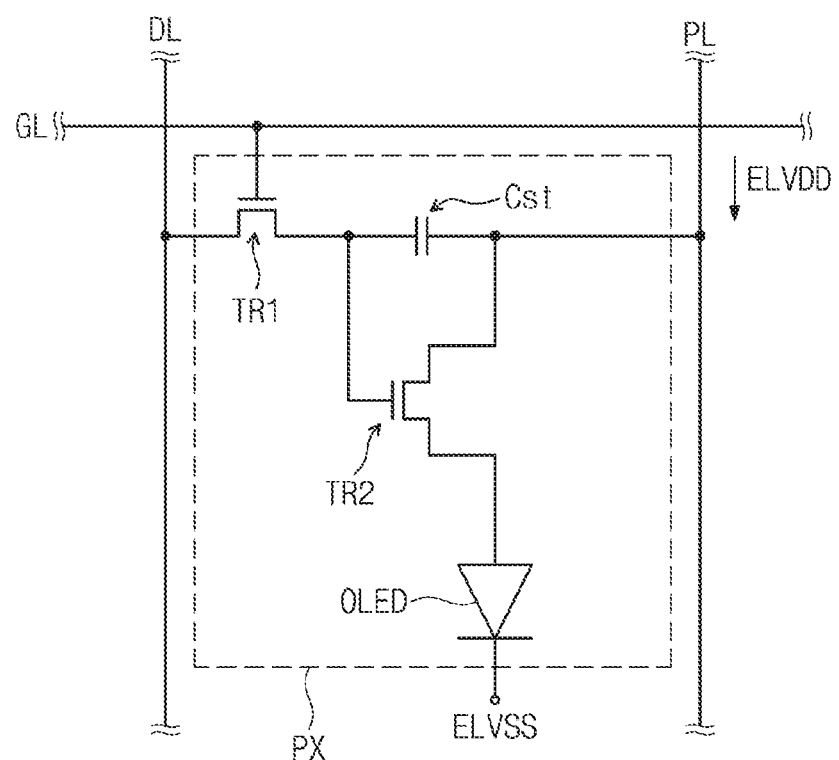
FIG. 4 is an equivalent circuit diagram of a pixel according to an exemplary embodiment of the inventive concept.
Figure 5:
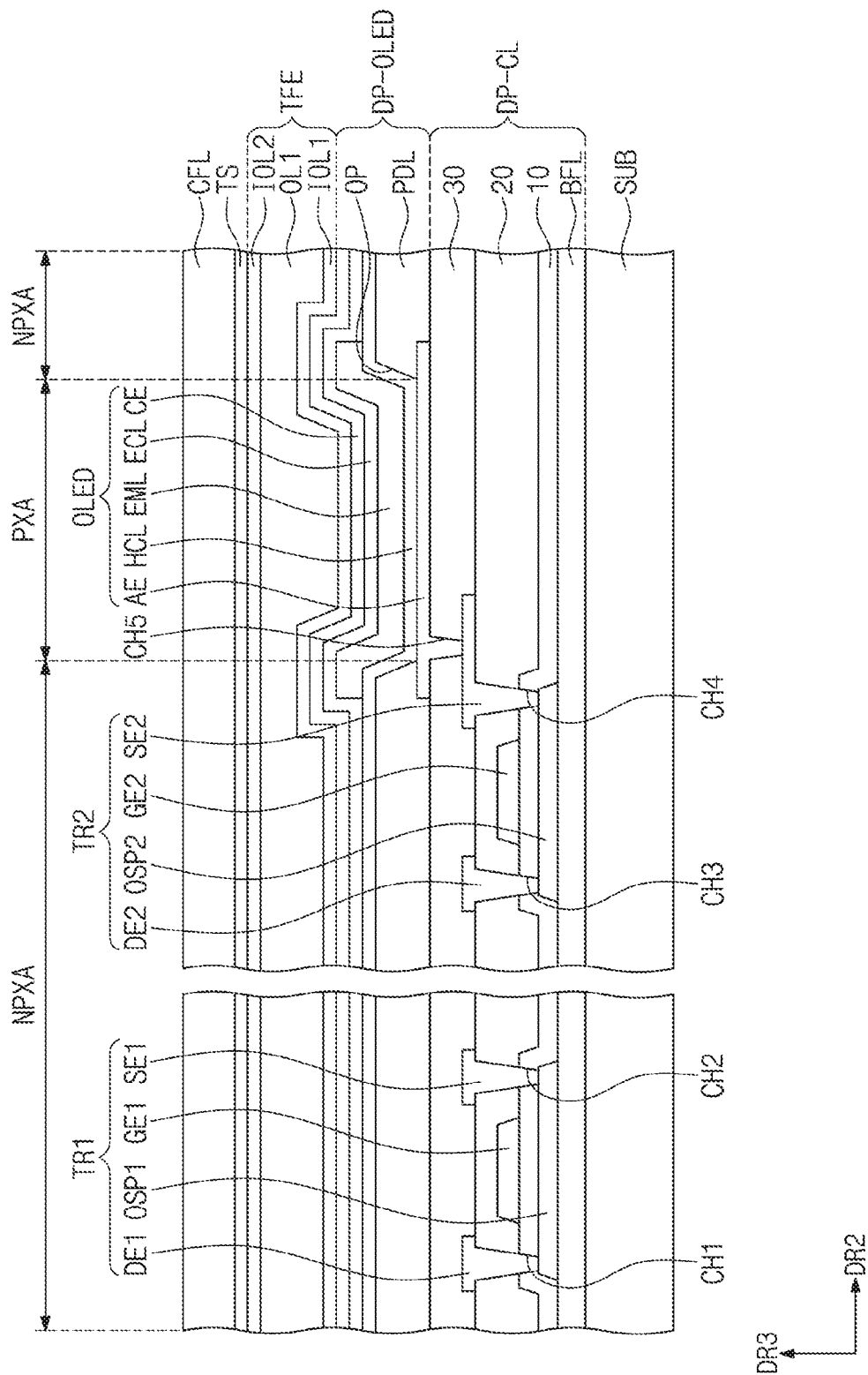
FIG. 5 is an enlarged cross-sectional view of a display panel according to an exemplary embodiment of the inventive concept.

FIG. 3 is a plan view of a display panel DP according to an exemplary embodiment of the inventive concept. FIG. 4 is an equivalent circuit diagram of a pixel PX according to an exemplary embodiment of the inventive concept. FIG. 5 is an enlarged cross-sectional view of a display panel DP according to an exemplary embodiment of the inventive concept.

As shown in FIG. 3, the display panel DP includes a display area DA and a non-display area NDA in a plane. In an exemplary embodiment, the non-display area NDA may be defined along the outline of the display area DA. The display area DA and the non-display area NDA of the display panel DP correspond to the display area DM-DA and the non-display area DM-NDA of the display module DM shown in FIG. 1, respectively. For example, the location of the display area DA and the non-display area NDA of the display panel DP correspond to the location of the display area DM-DA and the non-display area DM-NDA of the display module DM shown in FIG. 1, respectively. In an exemplary embodiment, the display area DA and the non-display area NDA of the display panel DP may not be the same as the display area DM-DA and the non-display area DM-NDA of the display module, and may be changed according to the structure/design of the display panel DP.

The display panel DP includes a plurality of pixels PX. The plurality of pixels PX may be disposed in the display area DA. Each of the pixels PX includes an organic light emitting diode and a pixel driving circuit connected thereto.

The display panel DP may include a plurality of signal lines and a pad portion PD. The plurality of signal lines may include gate lines GL, data lines DL, light emission lines EL, a control signal line SL-D, an initialization voltage line SL-Vint, a voltage line SL-VDD, and a power supply line E-VSS. The plurality of signal lines and the pad portion PD may be included in the circuit element layer DP-CL shown in FIG. 2.

Some of the gate lines GL, the data lines DL, the light emission lines EL, the control signal line SL-D, the initialization voltage line SL-Vint, the voltage line SL-VDD, and the power supply line E-VSS may be disposed at the same layer and some of these lines may be disposed at another layer.

The gate lines GL are respectively connected to corresponding pixels PX among the plurality of pixels PX, and the data lines DL are respectively connected to corresponding pixels PX among the plurality of pixels PX. Each of the light emission lines EL may be arranged parallel to a corresponding gate line among the gate lines GL. The control signal line SL-D may provide control signals to a gate driving circuit GDC. The initialization voltage line SL-Vint may provide an initialization voltage to the plurality of pixels PX. The voltage line SL-VDD may be connected to the plurality of pixels PX and provide a first voltage to the connected pixels PX. The voltage line SL-VDD may include a plurality of lines extending in the first direction DR1 and a plurality of lines extending in the second direction DR2. The power supply line E-VSS may surround three sides of the display area DA and may be disposed in the non-display area NDA. A common voltage (for example, a second voltage) may be provided to a plurality of pixels PX of the power supply line E-VSS. The common voltage may have a lower level voltage than the first voltage.

The display panel DP may further include the gate driving circuit GDC. The gate driving circuit GDC is disposed on one side of the non-display area NDA and may be connected to the gate lines GL and the light emission lines EL. The gate driving circuit GDC may be included in the circuit element layer DP-CL shown in FIG. 2. The gate driving circuit GDC may include a plurality of thin film transistors formed through the same process as the driving circuit of the pixels PX such as, for example, a Low Temperature Polycrystalline Silicon (LTPS) process or a Low Temperature Polycrystalline Oxide (LTPO) process. For example, the semiconductor of the thin film transistor included in the gate driving circuit GDC may include polysilicon or an oxide semiconductor.

The pad portion PD includes a plurality of pads. A portion of the pad portion PD may be connected to the ends of the data lines DL, the control signal line SL-D, the initialization voltage line SL-Vint, and the voltage line SL-VDD. Another portion of the pad portion PD may be connected to the touch signal lines of the touch detection unit TS.

The display panel DP may further include a bank disposed between the display area DA and the pad portion PD. The display panel DP may further include a dam portion surrounding the rim of the display area DA. The bank and the dam portion may prevent a particular layer from overflowing outside the bank or dam portion when forming the display panel DP by forming a specific layer through printing.

FIG. 4 exemplarily shows a pixel PX connected to any one gate line GL, any one data line DL, and a power line PL. A configuration of the pixel PX is not limited thereto and may be modified as necessary.

The pixel PX includes an organic light emitting diode OLED. The organic light emitting diode OLED may be a front-light-emitting-type diode or a rear-light-emitting-type diode. The pixel PX further includes a first transistor TR1 (also referred to as a switching transistor), a second transistor TR2 (also referred to as a driving transistor), and a capacitor Cst that function as a pixel driving circuit for driving the organic light emitting diode OLED. The first power voltage ELVDD is supplied to the second transistor TR2 and the second power voltage ELVSS is supplied to the organic light emitting diode OLED. The second voltage ELVSS may have a lower level than the first voltage ELVDD.

The first transistor TR1 outputs a data signal applied to the data line DL in response to a scan signal applied to the gate line GL. The capacitor Cst charges a voltage corresponding to a data signal received from the first transistor TR1.

The second transistor TR2 is connected to the organic light emitting diode OLED. The second transistor TR2 controls a driving current flowing through the organic light emitting diode OLED in correspondence to a charge amount stored in the capacitor Cst. The organic light emitting device OLED may emit light during a turn-on section of the second transistor TR2.

FIG. 5 shows a partial cross-sectional view of a display panel DP corresponding to the equivalent circuit shown in FIG. 4. A circuit element layer DP-CL, a display element layer DP-OLED, and a sealing layer TFE are sequentially arranged on the base layer SUB.

The circuit element layer DP-CL may include at least one inorganic film, at least one organic film, and a circuit element. The circuit element layer DP-CL may include a buffer layer BFL as an inorganic film, a first intermediate inorganic film 10, and a second intermediate inorganic film 20, and may also include an intermediate organic film 30 as an organic film.

The inorganic films may include, for example, silicon nitride, silicon oxynitride, silicon oxide, etc. The organic layer may include at least one of, for example, acrylic resin, methacrylic resin, polyisoprene, vinyl resin, epoxy resin, urethane resin, cellulose resin, siloxane-based resin, polyimide-based resin, polyamide-based resin, and perylene resin. The circuit element includes conductive patterns and/or semiconductor patterns.

The buffer layer BFL improves the coupling strength of the base layer SUB and conductive patterns or semiconductor patterns. A barrier layer for preventing a foreign material from entering may be further disposed at the upper surface of the base layer SUB. The buffer layer BFL and the barrier layer may be selectively disposed/omitted in exemplary embodiments.

A semiconductor pattern OSP1 (hereinafter referred to as a first semiconductor pattern) of the first transistor TR1 and a semiconductor pattern OSP2 (hereinafter referred to as a second semiconductor pattern) of the second transistor TR2 are disposed on the buffer layer BFL. The first semiconductor pattern OSP1 and the second semiconductor pattern OSP2 may be selected from, for example, amorphous silicon, polysilicon, and metal oxide semiconductors.

The first intermediate inorganic film 10 is disposed on the first semiconductor pattern OSP1 and the second semiconductor pattern OSP2. A control electrode GE1 (hereinafter referred to as a first control electrode) of the first transistor TR1 and a control electrode GE2 (hereinafter referred to as a second control electrode) of the second transistor TR2 are disposed on the first intermediate inorganic film 10. The first control electrode GE1 and the second control electrode GE2 may be manufactured according to the same photolithography process as the gate lines GL.

The second intermediate inorganic film 20 covering the first control electrode GE1 and the second control electrode GE2 is disposed on the first intermediate inorganic film 10. An input electrode DE1 (hereinafter referred to as a first input electrode) and an output electrode SE1 (hereinafter referred to as a first output electrode) of the first transistor TR1 and an input electrode DE2 (hereinafter referred to as a second input electrode) and an output electrode SE2 (hereinafter referred to as a second output electrode) of the second transistor TR2 are arranged on the second intermediate inorganic film 20.

The first input electrode DE1 and the first output electrode SE1 are connected to the first semiconductor pattern OSP1 through a first through hole CH1 and a second through hole CH2 penetrating the first intermediate inorganic film 10 and the second intermediate inorganic film 20. The second input electrode DE2 and the second output electrode SE2 are electrically connected to the second semiconductor pattern OSP2 through a third through hole CH3 and a fourth through hole CH4 penetrating the first intermediate inorganic film 10 and the second intermediate inorganic film 20. In contrast, according to an exemplary embodiment of the inventive concept, a portion of the first transistor TR1 and the second transistor TR2 may be modified as a bottom gate structure.

The intermediate organic film 30 covering the first input electrode DE1, the second input electrode DE2, the first output electrode SE1, and the second output electrode SE2 is formed on the second intermediate inorganic film 20. The intermediate organic film may provide a flat surface.

The display element layer DP-OLED is disposed on the intermediate organic film 30. The display element layer DP-OLED may include a pixel defining layer PDL and an organic light emitting diode OLED. The pixel defining layer PDL may include an organic material such as the intermediate organic film 30. A first electrode AE is disposed on the intermediate organic film 30. The first electrode AE is connected to the second output electrode SE2 through a fifth through hole CH5 passing through the intermediate organic film 30. An opening portion OP is defined in the pixel defining layer PDL. The opening portion OP of the pixel defining layer PDL exposes at least a portion of the first electrode AE.

The pixel PX may be disposed in a pixel area on a plane. The pixel area may include a light emitting area PXA and a non-light emitting area NPXA adjacent to the light emitting area PXA. The non-light emitting area NPXA may surround a plurality of light emitting areas PXA. According to an exemplary embodiment, the light emitting area PXA is defined corresponding to a partial area of the first electrode AE exposed by the opening portion OP. The light emitting area PXA is an area in which light emitted from the organic light emitting diode OLED is emitted to the outside, and the non-light emitting area NPXA is an area in which light emitted from the organic light emitting diode OLED is blocked. The non-light emitting area NPXA may be defined between a plurality of light emitting areas PXA. Although the non-light emitting area NPXA has been described thus far as being a single area connected as one, in the following exemplary embodiments, the non-light emitting area NPXA may be described as including a plurality of non-light emitting areas NPXA to allow for specific areas of the non-light emitting area NPXA to be referred to.

A hole control layer HCL may be commonly disposed in the light emitting area PXA and the non-light emitting area NPXA. A common layer such as the hole control layer HCL may be commonly formed in the plurality of pixels PX (see FIG. 3).

A light emitting layer EML is disposed on the hole control layer HCL. The light emitting layer EML may be disposed in an area corresponding to the opening portion OP. For example, the light emitting layer EML may be divided and formed at each of the plurality of pixels PX. The light emitting layer EML may include an organic material and/or an inorganic material. Although the patterned light emitting layer EML is shown exemplarily in FIG. 5, the light emitting layer EML may be commonly disposed in the plurality of pixels PX. The light emitting layer EML may generate red, green, blue, or white light, and is not limited to the color of the light to be produced. Additionally, the light emitting layer EML may have a multilayer structure.

An electronic control layer ECL is disposed on the light emitting layer EML. The electronic control layer ECL may be commonly formed at the plurality of pixels PX (see FIG. 3).

A second electrode CE is disposed on the electronic control layer ECL. The second electrode CE is commonly disposed at the plurality of pixels PX.

The sealing layer TFE is disposed on the second electrode CE. The sealing layer TFE is commonly disposed at the plurality of pixels PX. According to an exemplary embodiment, the sealing layer TFE directly covers the second electrode CE. For example, in an exemplary embodiment, the sealing layer TFE directly contacts and covers the second electrode CE.

The sealing layer TFE may include at least one sealing inorganic film and at least one sealing organic film. The sealing inorganic film and the sealing organic film may be alternately laminated.

In the exemplary embodiment of FIG. 5, the sealing layer TFE exemplarily includes first and second sealing inorganic films IOL1 and IOL2 and a first sealing organic film OL1.

The first sealing inorganic film IOL1, the first sealing organic film OL1, and the second sealing inorganic film IOL2 may be sequentially stacked on the second electrode CE.

The first sealing organic layer OL1 may be formed using an inkjet printing method or may be formed by coating a composition containing an acrylic monomer. The first and second sealing inorganic films IOL1 and IOL2 may have the same inorganic substance and may have different inorganic substances. The material constituting the first and second sealing inorganic films IOL1 and IOL2 is not particularly limited, and may include, for example, silicon nitride, silicon oxynitride, silicon oxide, etc.

According to an exemplary embodiment of the inventive concept, a capping layer covering the second electrode CE may be further disposed between the sealing layer TFE and the second electrode CE. The sealing layer TFE may directly cover the capping layer. For example, the sealing layer TFE may directly contact and cover the capping layer.

Figure 6:
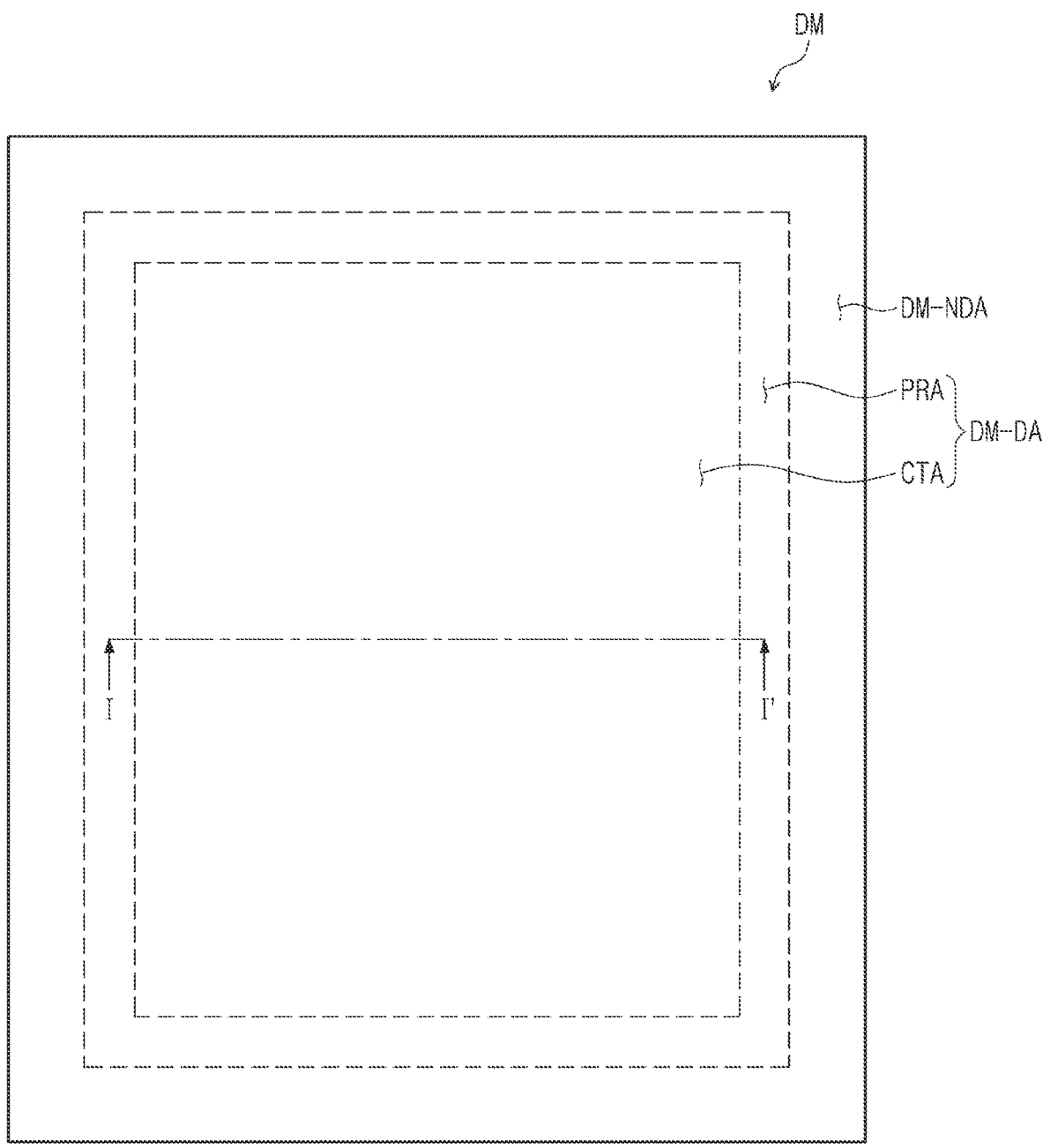
FIG. 6 is a plan view of a display module according to an exemplary embodiment of the inventive concept.
Figure 7:
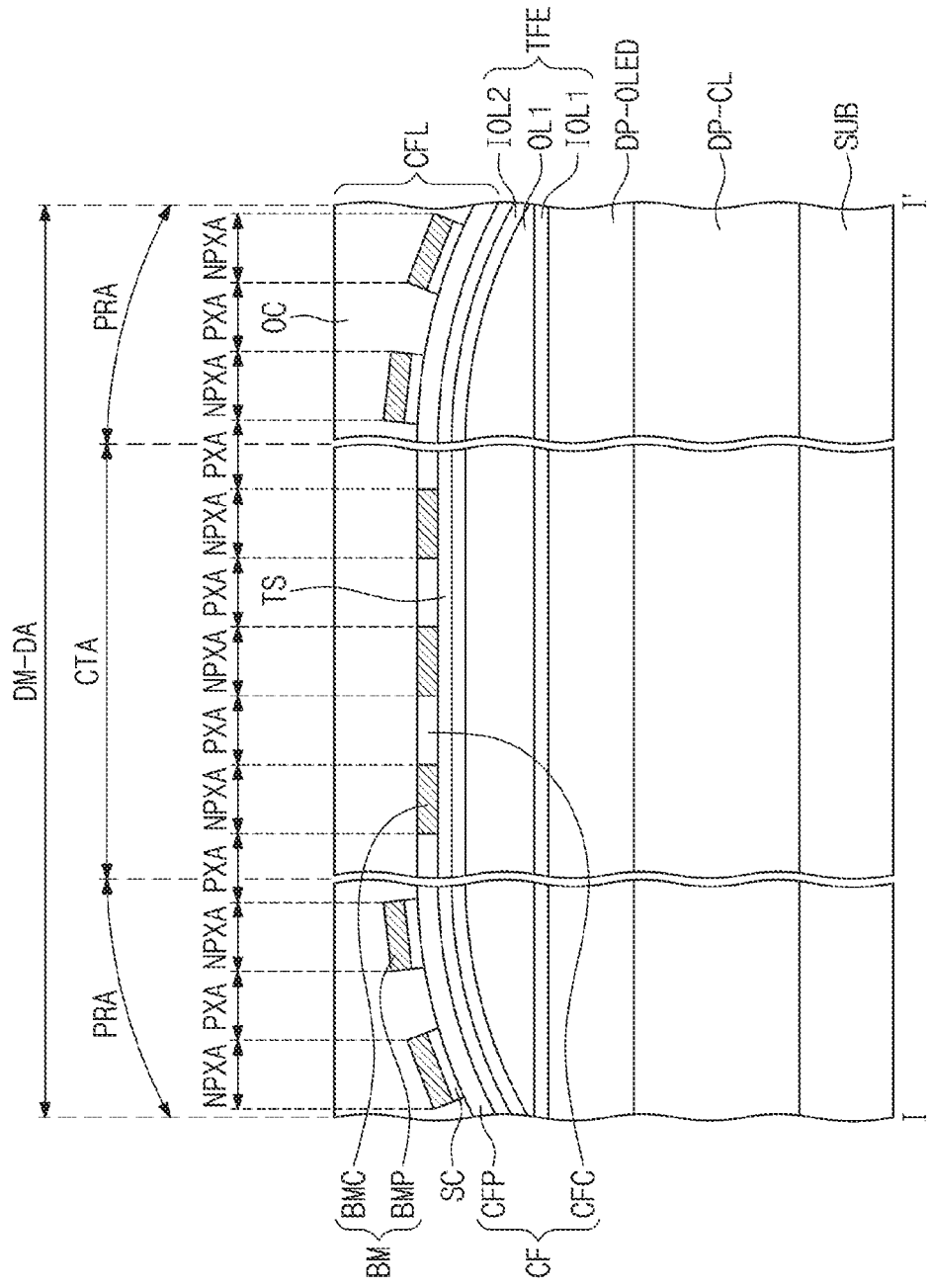
FIG. 7 is a cross-sectional view taken along line I-I' of FIG. 6.

FIG. 6 is a plan view showing a display module according to an exemplary embodiment of the inventive concept. FIG. 7 is a cross-sectional view taken along line I-I' of FIG. 6.

Referring to FIGS. 6 and 7, a display area DM-DA and a non-display area DM-NDA may be defined in the display module DM. A detailed description of the display area DM-DA and the non-display area DM-NDA is made with reference to FIG. 1. For convenience of explanation, a further description thereof will be omitted.

In the display area DM-DA, a center area CTA and a peripheral area PRA may be defined. The peripheral area PRA may be defined at the periphery of the center area CTA. In an exemplary embodiment of the inventive concept, the peripheral area PRA is shown as an area surrounding the center area CTA on a plane. For example, as shown in FIG. 6, in an exemplary embodiment, the peripheral area PRA entirely surrounds the center area CTA on a plane. However, the inventive concept is not limited thereto. For example, in exemplary embodiments, the peripheral area PRA may be defined at the periphery of the center area CTA without surrounding the center area CTA.

The first and second sealing inorganic films IOL1 and IOL2 and the first sealing organic film OL1 of the sealing layer TFE are arranged to cover the display area DM-DA.

In the process of forming the first sealing organic film OL1, organic matter may flow down from the peripheral area (PRA) as a result of a reflow phenomenon of organic matter. The thickness of the first sealing organic film OL1 in the center area CTA may be greater than the thickness of the first sealing organic film OL1 in the peripheral area PRA.

The color filter layer CFL may replace optical films such as a polarizing film and a λ/4 wavelength film preventing external light reflection.

The color filter layer CFL may include a black matrix BM, a color filter CF, a level difference compensating layer SC, and a planarization layer OC. FIG. 7 is a view illustrating a structure disposed in each of the center area CTA and the peripheral area PRA of the black matrix BM, the color filter CF, and the level difference compensating layer SC and in each of the light emitting area PXA and the non-light emitting area NPXA. Referring to FIG. 7, the inventive concept will be described, and the specific shape of the black matrix BM, the color filter CF, and the level difference compensating layer SC will be described later with reference to FIGS. 8 and 9.

The color filter CF may include a center color filter CFC and a peripheral color filter CFP.

The center color filter CFC may be disposed in the center area CTA, and the peripheral color filter CFP may be disposed in the peripheral area PRA. The center color filter CFC and the peripheral color filter CFP may be organic patterns including dyes or pigments. Each of the center color filter CFC and the peripheral color filter CFP may include a red color filter, a green color filter, and a blue color filter.

The black matrix BM may include a center black matrix BMC and a peripheral black matrix BMP.

The center black matrix BMC may be disposed in the center area CTA and the peripheral black matrix BMP may be disposed in the peripheral area PRA. In the center area CTA, portions of the center black matrix BMC may be disposed between adjacent portions of the center color filter CFC. The center black matrix BMC and the peripheral black matrix BMP may include an organic material as a base material. The center black matrix BMC and the peripheral black matrix BMP may include a black pigment or a black dye. The center black matrix BMC and the peripheral black matrix BMP may be made of the same material.

The level difference compensating layer SC may be disposed in the peripheral area PRA. For example, in an exemplary embodiment, the level difference compensating layer SC is disposed in the peripheral area PRA and is not disposed in the center area CTA. The level difference compensating layer SC may include the same material as the center color filter CFC and the peripheral color filter CFP.

The center color filter CFC is disposed to overlap the light emitting area PXA of the center area CTA, and the center black matrix BMC is disposed to overlap the non-light emitting area NPXA of the center area CTA. For example, in an exemplary embodiment, the center color filter CFC is disposed in areas corresponding to the light emitting area PXA, and the center black matrix BMC is disposed in areas corresponding to the non-light emitting area NPXA. The center black matrix BMC may be disposed on the same layer as the center color filter CFC. For example, in an exemplary embodiment, the center black matrix BMC and the center color filter CFC may both be disposed on the touch detection unit TS.

The peripheral color filter CFP may be disposed to overlap the light emitting area PXA of the peripheral area PRA, and the peripheral black matrix BMP may be disposed to overlap the non-light emitting area NPXA of the peripheral area PRA. The peripheral black matrix BMP may be disposed on the peripheral color filter CFP. In an exemplary embodiment, the peripheral color filter CFP may be disposed in both the light emitting area PXA and the non-light emitting area NPXA of the peripheral area PRA, and the peripheral black matrix BMP may be disposed in the non-light emitting area NPXA of the peripheral area PRA and not in the light emitting area PXA of the peripheral area PRA.

The level difference compensating layer SC may be disposed to overlap the non-light emitting area NPXA of the peripheral area PRA. In an exemplary embodiment, the level difference compensating layer SC may be disposed in the non-light emitting area NPXA of the peripheral area PRA and not in the light emitting area PXA of the peripheral area PRA. The level difference compensating layer SC may be disposed below the peripheral black matrix BMP. For example, in FIG. 7, it is shown illustratively that the level difference compensating layer SC is disposed between the peripheral color filter CFP and the peripheral black matrix BMP. However, the inventive concept is not limited thereto. For example, in an exemplary embodiment, the level difference compensating layer SC may be disposed under the peripheral color filter CFP.

The planarization layer OC is disposed on the black matrix BM, the color filter CF, and the level difference compensating layer SC. The planarization layer OC protects the black matrix BM, the color filter CF, and the level difference compensating layer SC and may provide a planarization surface to the upper surface.

The luminance ratio may be defined as the luminance of the light emitted from an oblique angle (45 degrees) with respect to the luminance of the front (0 degrees) emitted light. In addition, the viewing angle chrominance may be defined as a color difference due to the optical path difference according to the viewing angle. As the viewing angle luminance ratio is lower, the optical characteristics are excellent, and as the viewing angle chrominance is higher, the optical properties are excellent.

Depending on the difference in thickness of the first sealing organic film OL1 in the center area CTA and the peripheral area PRA, the optical characteristics may be different in the center area CTA and the peripheral area PRA of the display module DM. For example, the optical characteristics are relatively excellent in the peripheral area PRA where the thickness of the first sealing organic film OL1 is relatively small, and the quality of the optical characteristics may decrease in the center area CTA where the thickness of the first sealing organic film OL1 is large. For example, as the thickness of the first sealing organic film OL1 becomes larger, the quality of the optical characteristics may decrease.

In addition, the optical characteristics of the light emitted from the display module DM may vary depending on the distance between the black matrix BM and the organic light emitting diode OLED. For example, the optical characteristics are relatively excellent as the distance between the black matrix BM and the organic light emitting diode is relatively small, and the quality of the optical characteristics may decrease where the distance between the black matrix BM and the organic light emitting diode OLED is relatively large. For example, as the distance between the black matrix BM and the organic light emitting diode OLED becomes larger, the quality of the optical characteristics may decrease.

In an exemplary embodiment of the inventive concept, the difference in optical characteristics of the display module DM due to the difference in the thickness of the first sealing organic film OL1 in the center area CTA and the peripheral area PRA may be compensated by disposing the level difference compensating layer SC under the peripheral black matrix BMP disposed in the peripheral area PRA and by disposing adjacent peripheral color filters CFP overlapping each other under the peripheral black matrix BMP disposed in the peripheral area PRA.

Therefore, the display quality of the display module DM may be improved according to exemplary embodiments. For example, since the thickness of the first sealing organic film OL1 in the center area CTA is relatively larger than the thickness of the first sealing organic film OL1 in the peripheral area PRA, the distance between the center black matrix BMC and the organic light emitting diode OLED may be relatively reduced by disposing the center black matrix BMC on the same layer as the center color filter CFC or on a portion of the center color filter CFC. Also, since the thickness of the first sealing organic film OL1 in the peripheral area PRA is relatively smaller than the thickness of the first sealing organic film OL1 in the center area CTA, the distance between the peripheral black matrix BMP and the organic light emitting diode OLED may be relatively increased by disposing the peripheral black matrix BMP on the peripheral color filter CFP and by disposing the level difference compensating layer SC below the peripheral black matrix BMP. Therefore, according to an exemplary embodiment of the inventive concept, the optical characteristics of the display module DM may be uniform in the center area CTA and the peripheral area PRA.

Figure 8:
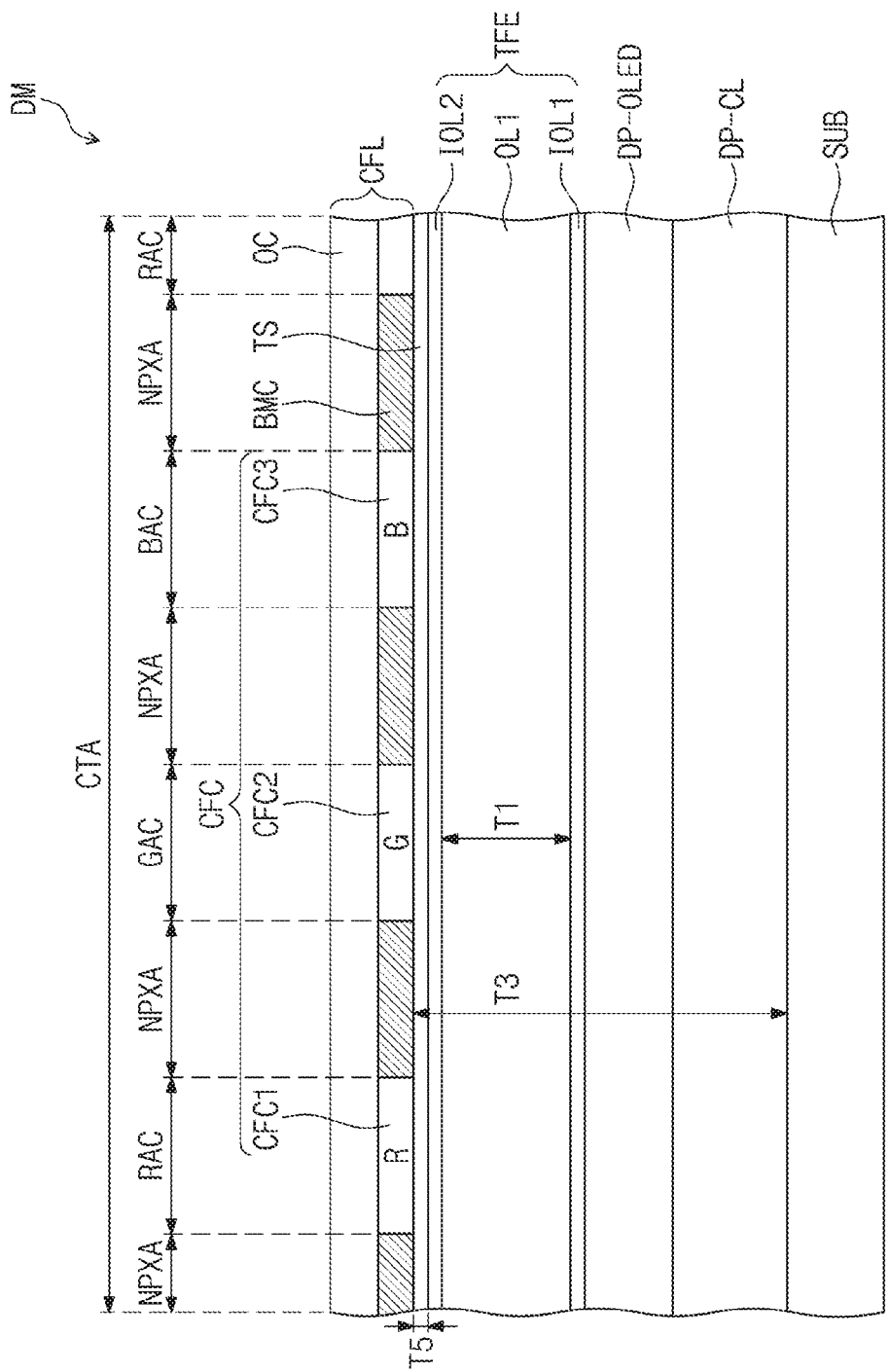
FIG. 8 is a cross-sectional view of a display module corresponding to the center area of FIG. 6.
Figure 9:
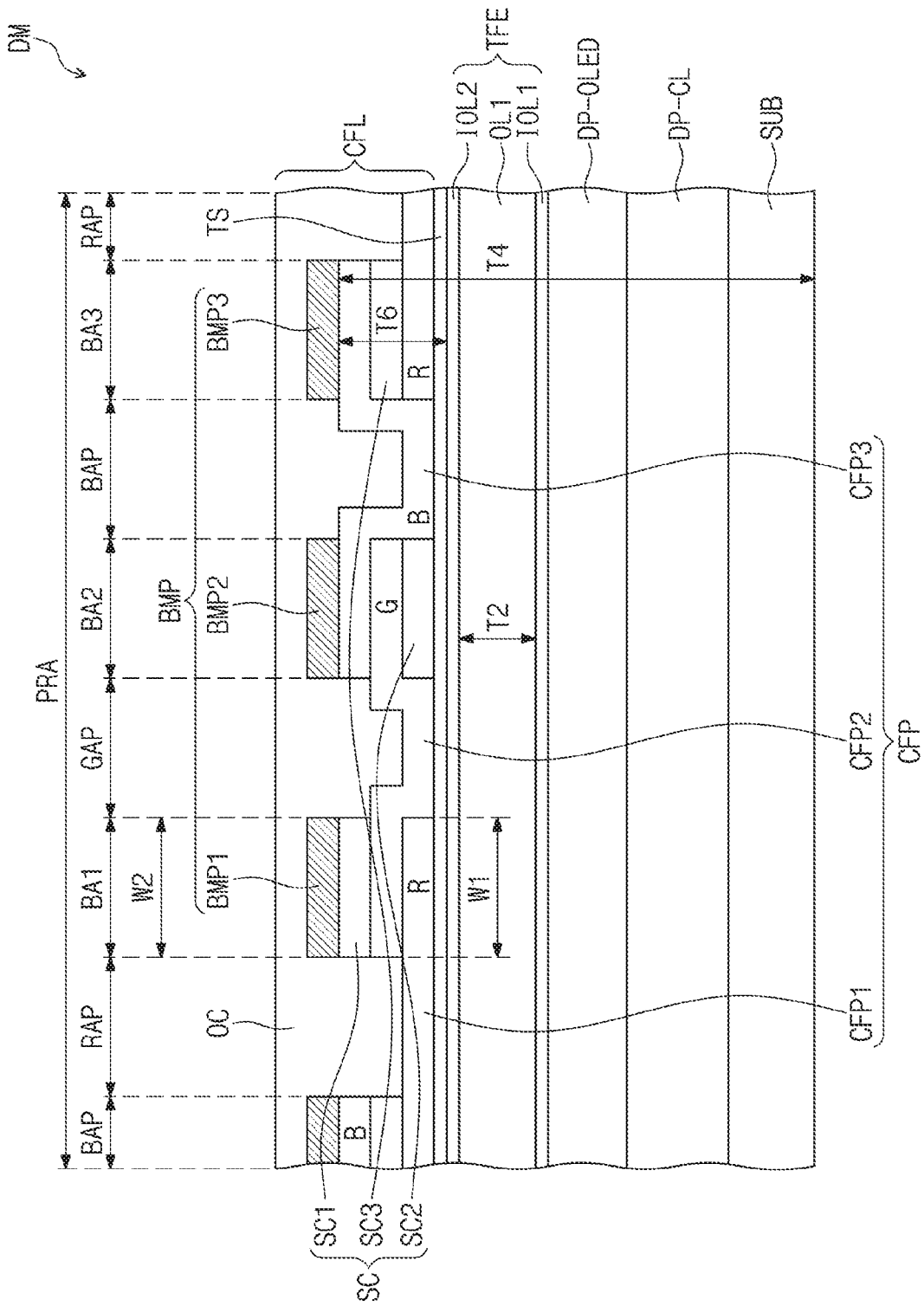
FIG. 9 is a cross-sectional view of a display module corresponding to the peripheral area of FIG. 6.

FIG. 8 is a cross-sectional view of the display module corresponding to the center area of FIG. 6. FIG. 9 is a cross-sectional view of the display module corresponding to the peripheral area of FIG. 6.

The light emitting area PXA of the display module DM may include a plurality of color areas depending on the color of the displayed light.

In FIG. 8, the light emitting area of the center area CTA may include a first center light emitting area RAC, a second center light emitting area GAC, and a third center light emitting area BAC.

In FIG. 9, the light emitting area of the peripheral area PRA may include a first peripheral light emitting area RAP, a second peripheral light emitting area GAP, and a third peripheral light emitting area BAP. The first peripheral light emitting area RAP, the second peripheral light emitting area GAP, and the third peripheral light emitting area BAP may be adjacent to each other in the peripheral area PRA (with peripheral non-light emitting areas disposed therebetween).

In an exemplary embodiment of the inventive concept, the first center light emitting area RAC and the first peripheral light emitting area RAP are areas displaying red color. The second center light emitting area GAC and the second peripheral light emitting area GAP are areas displaying green colors. The third center light emitting area BAC and the third peripheral light emitting area BAP are areas displaying blue color. However, the inventive concept is not limited thereto. For example, in an exemplary embodiment, the light emitting area of each of the center area CTA and the peripheral area PRA may include four or more color areas.

Referring to FIG. 8, a center color filter CFC may include first to third center color filters CFC1 to CFC3. The first center color filter CFC1 may be disposed to overlap the first center light emitting area RAC. For example, the first center color filter CFC1 may be disposed in the first center light emitting area RAC. The second center color filter CFC2 may be disposed to overlap the second center light emitting area GAC. For example, the second center color filter CFC2 may be disposed in the second center light emitting area GAC. The third center color filter CFC3 may be disposed to overlap the third center light emitting area BAC. For example, the third center color filter CFC3 may be disposed in the third center light emitting area BAC. In an exemplary embodiment of the inventive concept, the first center color filter CFC1 may be a red color filter, the second center color filter CFC2 may be a green color filter, and the third center color filter CFC3 may be a blue color filter.

In an exemplary embodiment, the first to third center color filters CFC1 to CFC3 do not overlap with each other.

In an exemplary embodiment, the center black matrix BMC may be in contact with side surfaces of each of the first to third center color filters CFC1, CFC2, and CFC3. In an exemplary embodiment, the lower surfaces of the first to third center color filters CFC1, CFC2 and CFC3 may be in contact with the touch detection unit TS, and the lower surface of the center black matrix BMC may be in contact with the touch detection unit TS. Thus, in an exemplary embodiment, the lower surface of the center black matrix BMC and the lower surfaces of the first to third center color filters CFC1, CFC2 and CFC3 may be in contact with the same layer (e.g., may be in direct contact with the same layer).

Referring to FIG. 9, the peripheral color filter CFP may include first to third peripheral color filters CFP1, CFP2 and CFP3. The first peripheral color filter CFP1 may be disposed to overlap the first peripheral light emitting area RAP. For example, the first peripheral color filter CFP1 may be disposed in the first peripheral light emitting area RAP. The second peripheral color filter CFP2 may be disposed to overlap the second peripheral light emitting area GAP. For example, the second peripheral color filter CFP2 may be disposed in the second peripheral light emitting area GAP. The third peripheral color filter CFP3 may be disposed to overlap the third peripheral light emitting area BAP. For example, the third peripheral color filter CFP3 may be disposed in the third peripheral light emitting area BAP. The first peripheral color filter CFP1 may be a red color filter, the second peripheral color filter CFP2 may be a green color filter, and the third peripheral color filter CFP3 may be a blue color filter. The first to third peripheral color filters CFP1, CFP2 and CFP3 may include different materials. The third peripheral color filter CFP3 may include the same material as the level difference compensating layer SC.

The non-light emitting area of the peripheral area PRA may include first to third peripheral non-light emitting areas BA1, BA2 and BA3. The first peripheral non-light emitting area BA1 may be defined as an area between the first peripheral light emitting area RAP and the second peripheral light emitting area GAP. The second peripheral non-light emitting area BA2 may be defined as an area between the second peripheral light emitting area GAP and the third peripheral light emitting area BAP. The third peripheral non-light emitting area BA3 may be defined as an area between the third peripheral light emitting area BAP and the first peripheral light emitting area RAP.

The peripheral black matrix BMP may include first to third peripheral black matrices BMP1, BMP2 and BMP3. The first peripheral black matrix BMP1 may be disposed to overlap the first peripheral non-light emitting area BA1. For example, the first peripheral black matrix BMP1 may be disposed in the first peripheral non-light emitting area BA1. The second peripheral black matrix BMP2 may be disposed to overlap the second peripheral non-light emitting area BA2. For example, the second peripheral black matrix BMP2 may be disposed in the second peripheral non-light emitting area BA2. The third peripheral black matrix BMP3 may be disposed to overlap the third peripheral non-light emitting area BA3. For example, the third peripheral black matrix BMP3 may be disposed in the third peripheral non-light emitting area BA3.

Each of the first to third peripheral color filters CFP1 to CFP3 may extend to adjacent non-light emitting areas as well as the first to third peripheral light emitting areas RAP, GAP, and BAP.

A portion of the first peripheral color filter CFP1 and a portion of the second peripheral color filter CFP2 may overlap the first peripheral black matrix BMP1. The width W1 of a portion of the first peripheral color filter CFP1 overlapping the second peripheral color filter CFP2 may be about equal to the width W2 of the first peripheral black matrix BMP1. For example, the width W1 corresponds to the portions of the first and second peripheral color filters CFP1 and CFP2 that overlap each other, and this width W1 may be about equal to the width W2 of the first peripheral black matrix BMP1. The widths W1 and W2 may be about equal to the width of the first peripheral non-light emitting area BA1.

Herein, when one value is described as being about equal to another value or substantially the same as another value, it is to be understood that the values are equal to each other to within a measurement error, or if measurably unequal, are close enough in value to be functionally equal to each other as would be understood by a person having ordinary skill in the art.

Another portion of the second peripheral color filter CFP2 and a portion of the third peripheral color filter CFP3 may overlap the second peripheral black matrix BMP2. The width of a portion of the second peripheral color filter CFP2 overlapping the third peripheral color filter CFP3 may be about equal to the width of the second peripheral black matrix BMP2.

Another portion of the third peripheral color filter CFP3 and another portion of the first peripheral color filter CFP1 may overlap the third peripheral black matrix BMP3. A portion of the third peripheral color filter CFP3 overlapping the first peripheral color filter CFP1 may be about equal to the width of the third peripheral black matrix BMP3.

It is to be understood that the order in which the first to third peripheral color filters CFP1 to CFP3 are stacked is not limited to the exemplary embodiment of FIG. 9. For example, in exemplary embodiments, the stacking order of the first to third peripheral color filters CFP1 to CFP3 may be changed to be different from the order shown in FIG. 9.

The level difference compensating layer SC may include first to third level difference compensating layers SC1, SC2 and SC3. The first level difference compensating layer SC1 may overlap the first peripheral black matrix BMP1 in the first peripheral non-light emitting area BA1. For example, the first level difference compensating layer SC1 may be disposed in the first peripheral non-light emitting area BA1, and the first peripheral black matrix BMP1 may be disposed on the first level difference compensating layer SC1. The second level difference compensating layer SC2 may overlap the second peripheral black matrix BMP2 in the second peripheral non-light emitting area BA2. For example, the second level difference compensating layer SC2 may be disposed in the second peripheral non-light emitting area BA2, and the second peripheral black matrix BMP2 may be disposed on the second level difference compensating layer SC2. The third level difference compensating layer SC3 may overlap the third peripheral black matrix BMP3 in the third peripheral non-light emitting area BA3. For example, the third level difference compensating layer SC3 may be disposed in the third peripheral non-light emitting area BA3, and the third peripheral black matrix BMP3 may be disposed on the third level difference compensating layer SC3. Each of the first to third peripheral black matrices BMP1 to BMP3 may be disposed on each of the first to third level difference compensating layers SC1 to SC3, respectively. The first to third level difference compensating layers SC1 to SC3 are not disposed in the first to third peripheral light emitting areas RAP, GAP, and BAP.

In an exemplary embodiment, the first to third level difference compensating layers SC1 to SC3 overlap a portion of the first to third peripheral color filters CFP1 to CFP3, and do not overlap the rest. The first to third level difference compensating layers SC1 to SC3 may include the same material as the peripheral color filter that does not overlap the level difference compensating layer SC, and may be formed in the same step.

For example, in an exemplary embodiment, the first level difference compensating layer SC1 overlaps the first and second peripheral color filters CFP1 and CFP2 and does not overlap the third peripheral color filter CFP3. The first level difference compensating layer SC1 may include the same material as the third peripheral color filter CFP3.

Similarly, in an exemplary embodiment, the second level difference compensating layer SC2 overlaps the second and third peripheral color filters CFP2 and CFP3 and does not overlap the first color filter CFP1. The second level difference compensating layer SC2 may include the same material as the first peripheral color filter CFP1.

Similarly, in an exemplary embodiment, the third level difference compensating layer SC3 overlaps the first and third peripheral color filters CFP1 and CFP3 and does not overlap the second peripheral color filter CFP2. The third level difference compensating layer SC3 may include the same material as the second peripheral color filter CFP2.

The first level difference compensating layer SC1 may be disposed on the first and second peripheral color filters CFP1 and CFP2 overlapping each other. The second level difference compensating layer SC2 may be disposed between the second and third peripheral color filters CFP2 and CFP3 overlapping each other. The third level difference compensating layer SC3 may be disposed below the first and third peripheral color filters CFP1 and CFP3 overlapping each other.

The width of each of the first to third level difference compensating layers SC1 to SC3 may be substantially the same as the width of each of the first to third peripheral black matrices BMP1 to BMP3.

Referring to FIGS. 8 and 9, the first sealing organic film OL1 has a first thickness T1 in the center area CTA, and the first sealing organic film OL1 has a second thickness T2 smaller than the first thickness T1 in the peripheral area PRA. The thickness of the first sealing organic film OL1 in the peripheral area PRA may vary depending on the position rather than having a constant value, and the average thickness of the first sealing organic film OL1 in the peripheral area PRA may be the second thickness T2.

The center black matrix BMC and the base layer SUB may be spaced apart from each other by a third distance T3, and the peripheral black matrix BMP and the base layer SUB may be spaced apart from each other by a fourth distance T4. The third distance T3 and the fourth distance T4 may be substantially the same within an error range.

A fifth distance T5 between the center black matrix BMC and the second sealing inorganic layer IOL2 of the sealing layer TFE may be smaller than a sixth distance T6 between the peripheral black matrix BMP and the second sealing inorganic layer IOL2 of the sealing layer TFE.

As a result of an experiment, it was confirmed that the first thickness T1 and the second thickness T2 may have a difference of about 4 μm. According to exemplary embodiments, the thicknesses of the first to third peripheral color filters CFP1 to CFP3 and the first to third level difference compensating layers SC1 to SC3 may be appropriately controlled to compensate for the difference between the first thickness T1 and the second thickness T2. It is to be understood that the inventive concept is not limited to a configuration in which the difference between the first thickness T1 and the second thickness T2 is about 4 μm.

According to a display device according to an exemplary embodiment of the inventive concept, the difference in optical characteristics of the display module DM due to the difference in the thickness of the first sealing organic film OL1 in the center area CTA and the peripheral area PRA may be compensated by disposing the level difference compensating layer SC below the peripheral black matrix BMP disposed in the peripheral area PRA and by disposing adjacent peripheral color filters overlapping each other under the peripheral black matrix BMP disposed in the peripheral area PRA.

As shown in FIG. 9, in an exemplary embodiment, the first level difference compensating layer SC1 may be disposed on a different layer than the first and second peripheral color filters CFP1 and CFP2 in the first peripheral non-light emitting area BA1 located between the first and second peripheral light emitting areas RAP and GAP. For example, in the first peripheral non-light emitting area BA1 located between the first and second peripheral light emitting areas RAP and GAP, the first peripheral color filter CFP1 may be disposed on the touch detection unit TS, the second peripheral color filter CFP2 may be disposed on the first peripheral color filter CFP1, and the first level difference compensating layer SC1 may be disposed on the second peripheral color filter CFP2.

Figure 10:
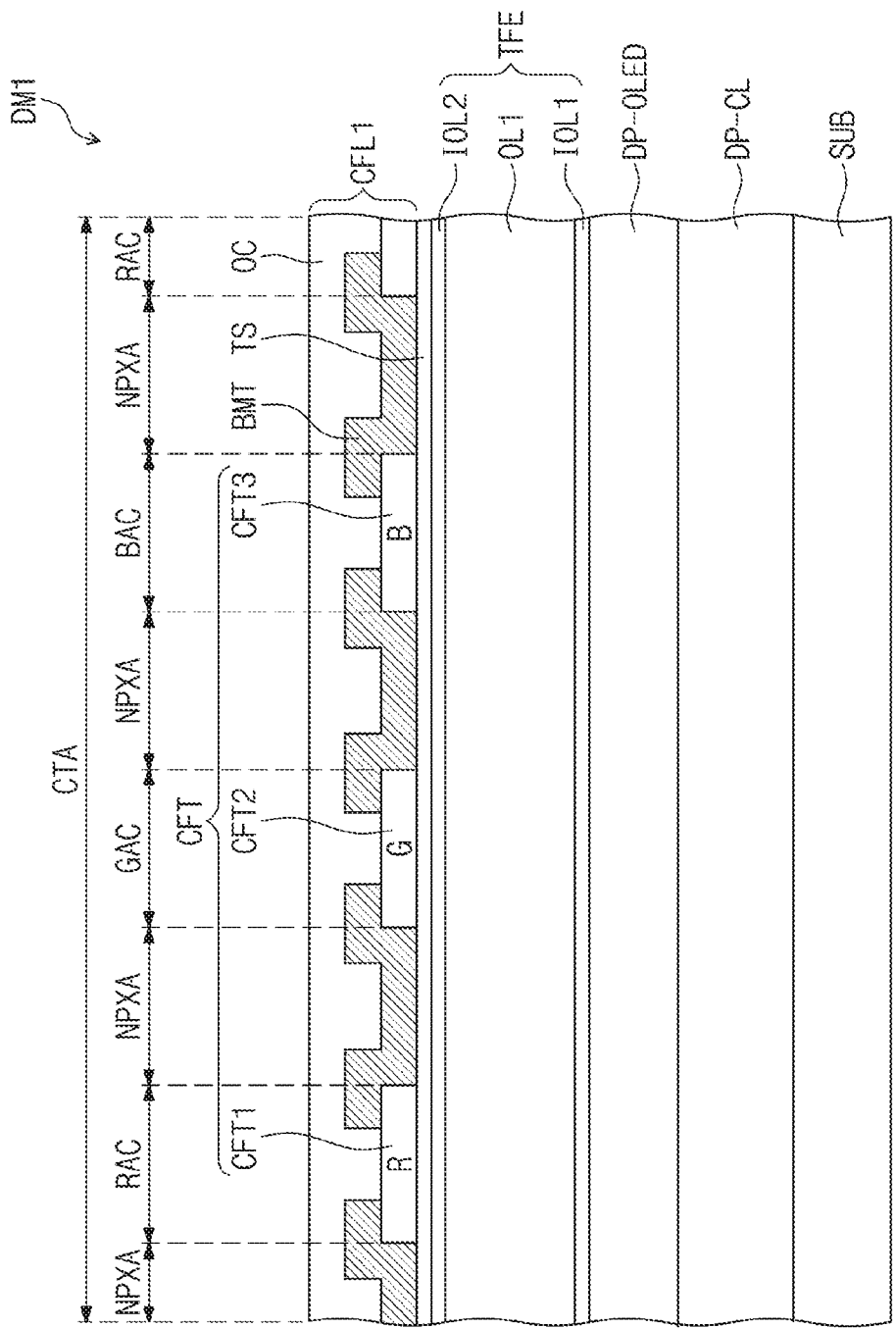
FIG. 10 is a cross-sectional view of a display module corresponding to the center area of FIG. 6 according to an exemplary embodiment of the inventive concept.

FIG. 10 is a cross-sectional view of a display module corresponding to the center area of FIG. 6 according to an exemplary embodiment of the inventive concept.

The display module DM1 of FIG. 10 is substantially the same as the display module DM of FIG. 8, except for differences between the color filter layer CFL of the display module DM of FIG. 8 and the color filter layer CFL1 of the display module DM1 of FIG. 10. Hereinafter, for convenience of explanation, differences between the display module DM1 of FIG. 10 and the display module DM of FIG. 8 will be mainly described, and a detailed description of elements and technical aspects previously described may be omitted.

The center color filter CFT may include first to third center color filters CFT1, CFT2 and CFT3 and a center black matrix BMT.

The center black matrix BMT may be disposed in a non-light emitting area NPXA of the center area CTA and disposed on a portion of the first to third center color filters CFT1 to CFT3. For example, in an exemplary embodiment, the center black matrix BMT may be disposed in an entirety of the non-light emitting area NPXA of the center area CTA, and may be partially disposed in the first center light emitting area RAC, the second center light emitting area GAC, and the third center light emitting area BAC.

Figure 11:
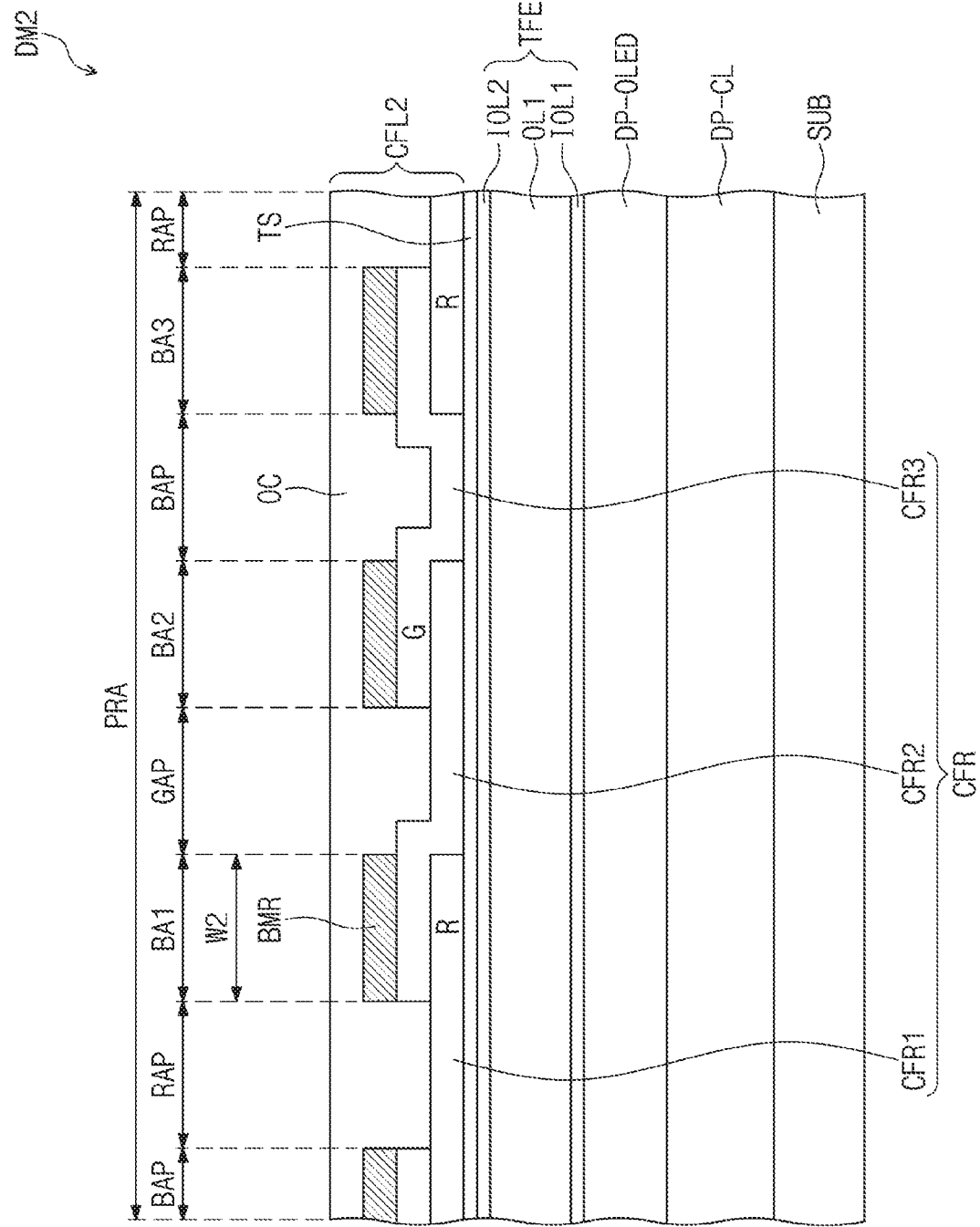
FIG. 11 is a cross-sectional view of a display module corresponding to the peripheral area of FIG. 6 according to an exemplary embodiment of the inventive concept.

FIG. 11 is a cross-sectional view of a display module corresponding to the peripheral area of FIG. 6 according to an exemplary embodiment of the inventive concept.

The display module DM2 of FIG. 11 is substantially the same as the display module DM of FIG. 9, except for differences between the color filter layer CFL of the display module DM of FIG. 9 and the color filter layer CFL2 of the display module DM2 of FIG. 11. Hereinafter, for convenience of explanation, differences between the display module DM2 of FIG. 11 and the display module DM of FIG. 9 will be mainly described, and a further description of elements and technical aspects previously described may be omitted.

The display module DM2 of FIG. 11 does not include a level difference compensating layer unlike the display module DM of FIG. 9.

The peripheral color filter CFR may include first to third peripheral color filters CFR1, CFR2 and CFR3.

Each of the first to third peripheral color filters CFR1 to CFR3 may extend to adjacent non-light emitting areas as well as the first to third peripheral light emitting areas RAP, GAP, and BAP.

In each of the first to third peripheral non-light emitting areas BA1 to BA3, the two peripheral color filters adjacent to each other among the first to third peripheral color filters CFR1 to CFR3 may overlap each other. For example, a portion of the second peripheral color filter CFR2 may be disposed on a portion of the first peripheral color filter CFR1 in the first peripheral non-light emitting area BA1, and a portion of the third peripheral color filter CFR3 may be disposed on a portion of the second peripheral color filter CFR2 in the second peripheral non-light emitting area BA2.

A peripheral black matrix BMR may be in contact with at least one of the first to third peripheral color filters CFR1 to CFR3. For example, as shown in FIG. 11, in an exemplary embodiment, the peripheral black matrix BMR is disposed on and directly contacts a portion of the second peripheral color filter CFR2 in the first peripheral non-light emitting area BA1, and is disposed on and directly contacts portions of the third peripheral color filter CFR3 in the second and third peripheral non-light emitting areas BA2 and BA3.

According to an exemplary embodiment of the inventive concept, the first to third center color filters CFC1 to CFC3 do not overlap each other in the non-light emitting area of the center area CTA, and portions of the first to third peripheral color filters CFR1 to CFR3 overlap each other in the non-light emitting area of the peripheral area PRA. As a result, the distance between the center black matrix BMC and the base layer SUB and the distance between the peripheral black matrix BMR and the base layer SUB may be substantially the same within an error range. Therefore, the difference in optical characteristics of the display module DM due to the difference in the thickness of the first sealing organic film OL1 in the center area CTA and the peripheral area PRA may be compensated according to exemplary area embodiments, resulting in an improved display device 1000.

In an exemplary embodiment of the inventive concept, the difference in optical characteristics of the display module due to the difference in the thickness of the first sealing organic film in the center area and the peripheral area may be compensated by disposing the level difference compensating layer under the peripheral black matrix disposed in the peripheral area, and by disposing the adjacent peripheral color compensating layers overlapping each other under the peripheral black matrix disposed in the peripheral area. As a result, the display quality of a display module may be improved.

While the inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
   a display panel comprising a display area in which an image is displayed,
   wherein a center area and a peripheral area outside the center area are defined in the display area, and a plurality of light emitting areas and a non-light emitting area are defined in the display area; and
   a color filter layer disposed on the display panel and comprising a black matrix and a color filter,
   wherein the black matrix comprises a center black matrix disposed in the non-light emitting area of the center area and a peripheral black matrix disposed in the non-light emitting area of the peripheral area,
   wherein the color filter comprises a plurality of center color filters disposed in the light emitting areas of the center area and a plurality of peripheral color filters disposed in the light emitting areas of the peripheral area,
   wherein first and second light emitting areas adjacent to each other from among the plurality of light emitting areas are defined in the peripheral area,
   wherein a first peripheral color filter from among the plurality of peripheral color filters is disposed in the first light emitting area, a second peripheral color filter from among the plurality of peripheral color filters is disposed in the second light emitting area, and the first and second peripheral color filters overlap each other in the non-light emitting area between the first and second light emitting areas,
   wherein the center color filters do not overlap each other.

2. The display device of claim 1, further comprising:
   a level difference compensating layer disposed in the non-light emitting area of the peripheral area and disposed below the peripheral black matrix.

3. The display device of claim 2, wherein a third light emitting area different from the first and second light emitting areas from among the plurality of light emitting areas is further defined in the peripheral area,
   wherein a third peripheral color filter from among the plurality of peripheral color filters is disposed in the third light emitting area, wherein the level difference compensating layer is disposed in the non-light emitting area between the first and second light emitting areas,
wherein the first to third peripheral color filters comprise different materials,
wherein the level difference compensating layer comprises the same material as the third peripheral color filter.

4. The display device of claim 3, wherein the level difference compensating layer is disposed between the peripheral black matrix and the first and second peripheral color filters overlapping each other.

5. The display device of claim 3, wherein the level difference compensating layer is disposed between the first and second peripheral color filters.

6. The display device of claim 3, wherein the level difference compensating layer is disposed below the first and second peripheral color filters.

7. The display device of claim 1, wherein the display panel comprises:
a base layer;
a plurality of display elements disposed on the base layer, disposed in the display area, and configured to display the image; and
a sealing layer configured to seal the display elements.

8. The display device of claim 7, wherein the plurality of display elements is disposed in the plurality of light emitting areas.

9. The display device of claim 7, wherein the sealing layer comprises a sealing organic film covering the display area,
wherein the sealing organic film in the center area has a first thickness, and the sealing organic film in the peripheral area has a second thickness less than the first thickness.

10. The display device of claim 9, wherein the sealing organic film comprises an acrylic monomer.

11. The display device of claim 9, wherein the sealing layer further comprises first and second sealing inorganic films facing each other with the sealing organic film disposed therebetween.

12. The display device of claim 1, wherein each of the center color filters is disposed in one of the light emitting areas of the center area, and the center black matrix is disposed on a portion of each of the center color filters.

13. The display device of claim 1, wherein a third light emitting area different from the first and second light emitting areas from among the plurality of light emitting areas is further defined in the peripheral area,
wherein a third peripheral color filter from among the plurality of peripheral color filters is disposed in the third light emitting area,
wherein the first to third peripheral color filters comprise different materials,
wherein the peripheral black matrix is in contact with at least one of the first to third peripheral color filters.

14. The display device of claim 1, wherein a width of a portion of the first peripheral color filter overlapping the second peripheral color filter is about equal to a width of the non-light emitting area disposed between the first and second light emitting areas.

15. The display device of claim 1, wherein a lower surface of the center black matrix and a lower surface of each of the center color filters contacts a same layer.

16. A display device, comprising:
a display panel comprising a display area in which an image is displayed,
wherein a center area and a peripheral area outside the center area are defined in the display area, and a plurality of light emitting areas and a non-light emitting area are defined in the display area; and
a color filter layer disposed on the display panel and comprising a black matrix, a color filter, and a level difference compensating layer,
wherein the black matrix comprises a center black matrix disposed in the non-light emitting area of the center area and a peripheral black matrix disposed in the non-light emitting area of the peripheral area,
wherein the color filter comprises a plurality of center color filters disposed in the light emitting areas of the center area and a plurality of peripheral color filters disposed in the light emitting areas of the peripheral area,
wherein first and second light emitting areas adjacent to each other from among the plurality of light emitting areas are defined in the peripheral area,
wherein a first peripheral color filter from among the plurality of peripheral color filters is disposed in the first light emitting area, a second peripheral color filter from among the plurality of peripheral color filters is disposed in the second light emitting area, and the first and second peripheral color filters overlap each other in the non-light emitting area between the first and second light emitting areas,
wherein the level difference compensating layer is disposed on a different layer than the first and second peripheral color filters in the non-light emitting area between the first and second light emitting areas.

17. The display device of claim 16, wherein the level difference compensating layer is disposed below the peripheral black matrix,
wherein a third light emitting area from the plurality of light emitting areas different from the first and second light emitting areas is further defined in the peripheral area,
wherein a third peripheral color filter from among the plurality of peripheral color filters is disposed in the third light emitting area,
wherein the level difference compensating layer is disposed in the non-light emitting area between the second and third light emitting areas,
wherein the first to third peripheral color filters comprise different materials,
wherein the level difference compensating layer comprises the same material as the third peripheral color filter.

18. A display device, comprising:
a display panel comprising a display area in which an image is displayed,
wherein a center area and a peripheral area outside the center area are defined in the display area, and a plurality of light emitting areas and a non-light emitting area are defined in the display area; and
a color filter layer disposed on the display panel and comprising a black matrix and a color filter,
wherein the black matrix comprises a center black matrix disposed in the non-light emitting area of the center area and a peripheral black matrix disposed in the non-light emitting area of the peripheral area,
wherein the color filter comprises a plurality of center color filters in the light emitting areas of the center area and a plurality of peripheral color filters disposed in the light emitting areas of the peripheral area, wherein a distance between the center black matrix and the display panel is less than a distance between the peripheral black matrix and the display panel.

19. The display device of claim 18, wherein the display panel comprises:
a base layer;
a plurality of display elements disposed on the base layer, disposed in the display area, and configured to display the image; and
a sealing layer configured to seal the display elements.

20. The display device of claim 19, wherein the sealing layer comprises a sealing organic film covering the display area,
wherein the sealing organic film in the center area has a first thickness, and the sealing organic film in the peripheral area has a second thickness less than the first thickness.

* * * * *